United States Patent
Sakamoto et al.

(10) Patent No.: US 10,490,743 B2
(45) Date of Patent: Nov. 26, 2019

(54) CROSSBAR SWITCH AND METHOD OF MANUFACTURING THE SAME AND SEMICONDUCTOR DEVICE

(71) Applicant: NEC Corporation, Minato-ku, Tokyo (JP)

(72) Inventors: Toshitsugu Sakamoto, Tokyo (JP); Munehiro Tada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/761,191

(22) PCT Filed: Sep. 16, 2016

(86) PCT No.: PCT/JP2016/004240
§ 371 (c)(1),
(2) Date: Mar. 19, 2018

(87) PCT Pub. No.: WO2017/051527
PCT Pub. Date: Mar. 30, 2017

(65) Prior Publication Data
US 2018/0261765 A1 Sep. 13, 2018

(30) Foreign Application Priority Data

Sep. 24, 2015 (JP) .................... 2015-186356

(51) Int. Cl.
*H01L 45/00* (2006.01)
(52) U.S. Cl.
CPC ........ *H01L 45/1253* (2013.01); *H01L 45/085* (2013.01); *H01L 45/1206* (2013.01);
(Continued)
(58) Field of Classification Search
CPC ... H01L 45/1253; H01L 45/00; H01L 45/142; H01L 45/146; H01L 45/1616; H01L 45/1675; H01L 49/00
See application file for complete search history.

(56) References Cited

U.S. PATENT DOCUMENTS

| 8,492,793 | B2 * | 7/2013 | Ikeda ................ B82Y 10/00 257/192 |
| 2006/0073631 | A1 * | 4/2006 | Karpov ............... H01L 27/2427 438/102 |

(Continued)

FOREIGN PATENT DOCUMENTS

| JP | 2009-21602 A | 1/2009 |
| JP | 2012-204399 A | 10/2012 |

(Continued)

OTHER PUBLICATIONS

Kaeriyama et al., "A Nonvolatile Programmable Solid-Electrolyte Nanometer Switch", IEEE Journal of Solid-State Circuits, Jan. 2005, vol. 40, No. 1, pp. 168-176.

(Continued)

*Primary Examiner* — Fernando L Toledo
*Assistant Examiner* — Neil R Prasad

(57) ABSTRACT

A crossbar switch comprising: a first interconnect, a second interconnect, and a resistance change element. The resistance change element includes: a first electrode connected to the first interconnect and a second electrode connected to the second interconnect which are embedded in a first insulating film on a substrate having a transistor; a second insulating film covering the first insulating film and the first and second electrodes; first and second opening portions exposing parts of an upper surface including end portions of the first and second electrodes from the second insulating film with translational symmetry; first and second resistance change films covering the first and second opening portions and connecting to the first and second electrodes at the opening portions; third and fourth electrodes connecting to the first and second resistance change films; a fifth electrode connecting to the third and fourth electrodes and to a diffusion layer of the transistor.

20 Claims, 18 Drawing Sheets

(52) U.S. Cl.
CPC ........ *H01L 45/1266* (2013.01); *H01L 45/142* (2013.01); *H01L 45/146* (2013.01); *H01L 45/1616* (2013.01); *H01L 45/1675* (2013.01)

(56) References Cited

U.S. PATENT DOCUMENTS

| | | |
|---|---|---|
| 2009/0017577 A1 | 1/2009 | An et al. |
| 2009/0104779 A1* | 4/2009 | Seko ............... H01L 27/2472 438/702 |
| 2009/0111228 A1* | 4/2009 | Breitwisch ........ H01L 21/76843 438/261 |
| 2012/0243296 A1 | 9/2012 | Watanabe et al. |
| 2015/0340606 A1 | 11/2015 | Tada et al. |
| 2017/0309497 A1* | 10/2017 | Dieny .................... H01L 45/06 |

FOREIGN PATENT DOCUMENTS

| | | |
|---|---|---|
| WO | 2010/079827 A1 | 7/2010 |
| WO | 2011/158821 A1 | 12/2011 |
| WO | 2011/158887 A1 | 12/2011 |
| WO | 2012/043502 A1 | 4/2012 |
| WO | 2013/018842 A1 | 2/2013 |
| WO | 2014/112365 A1 | 7/2014 |

OTHER PUBLICATIONS

Tada et al., "Highly Reliable, Complementary Atom Switch (CAS) with Low Programming Voltage Embedded in Cu BEOL for Non-volatile Programmable Logic", IEDM, Technical Digest, 2011, pp. 689-692.

International Search Report dated Nov. 8, 2016, issued by the International Searching Authority in application No. PCT/JP2016/004240.

* cited by examiner

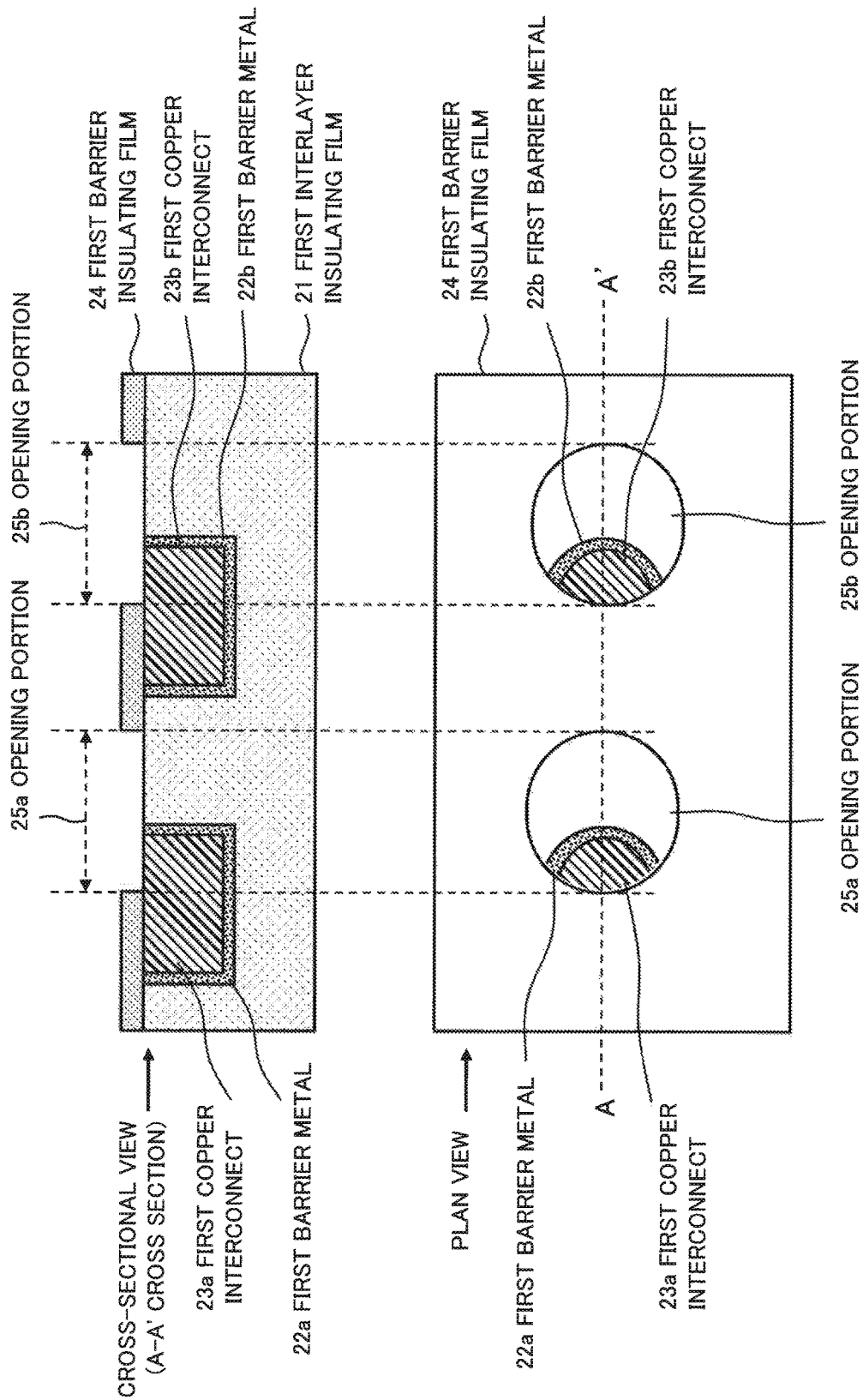

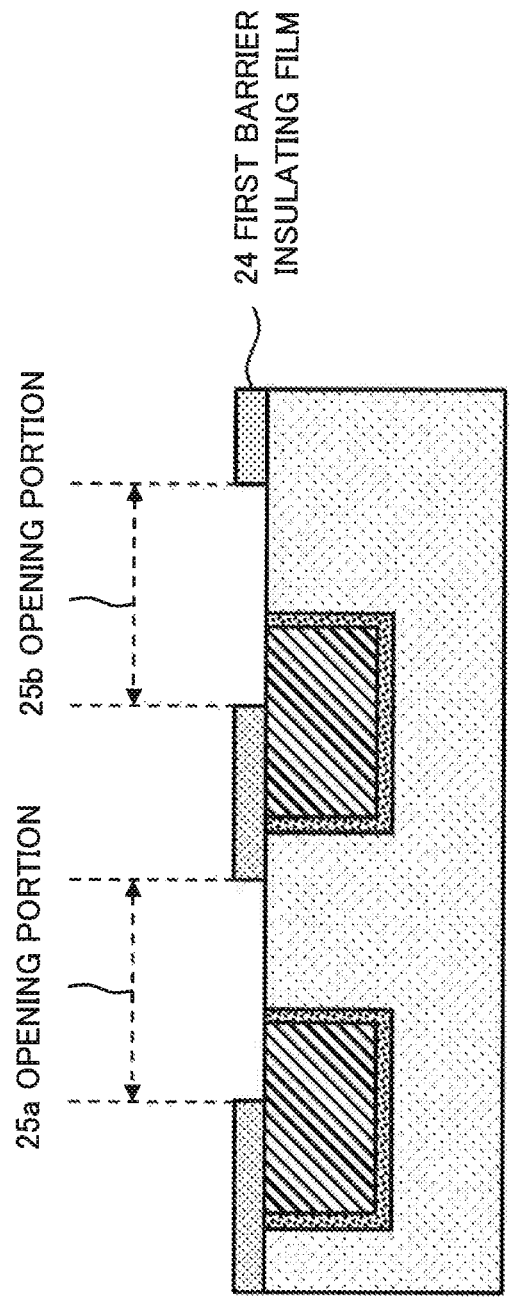

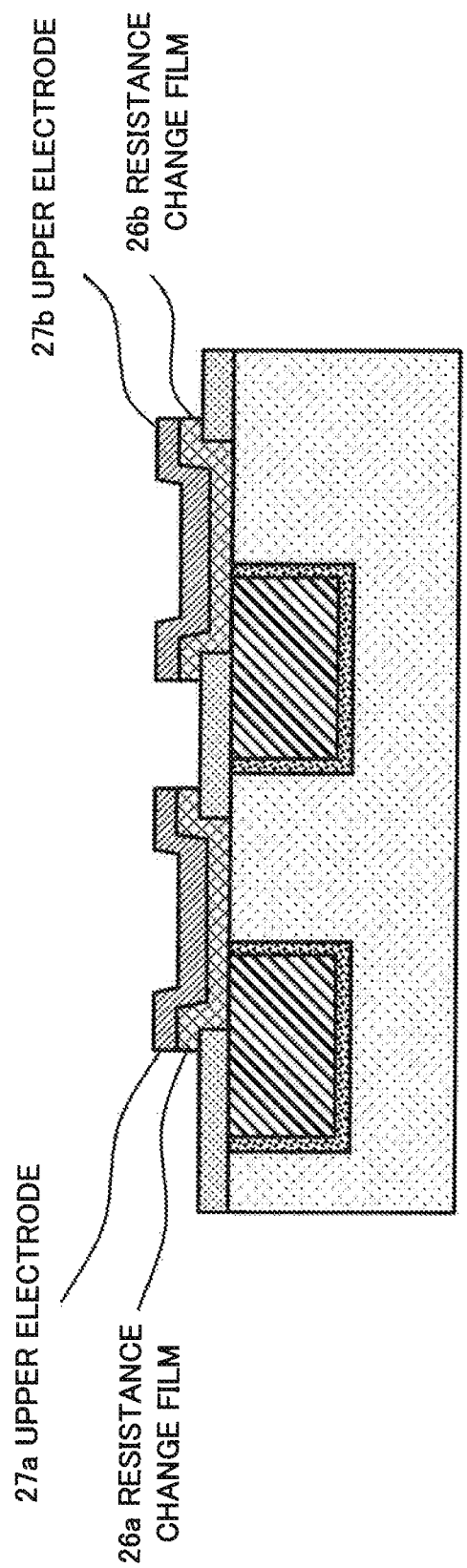

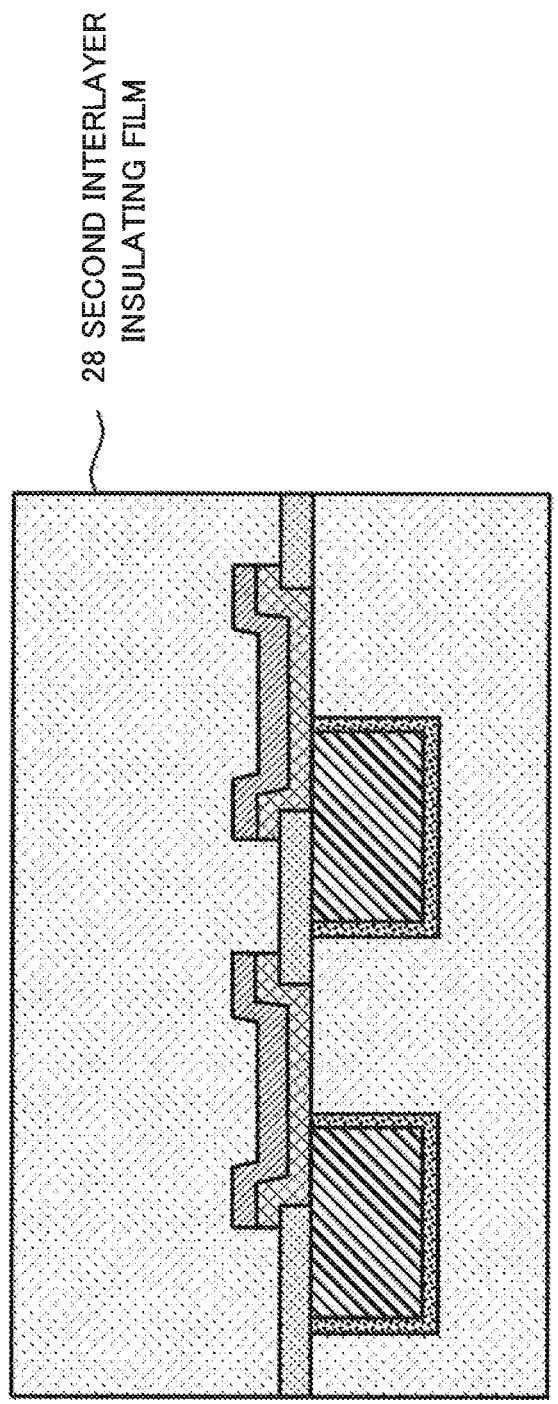

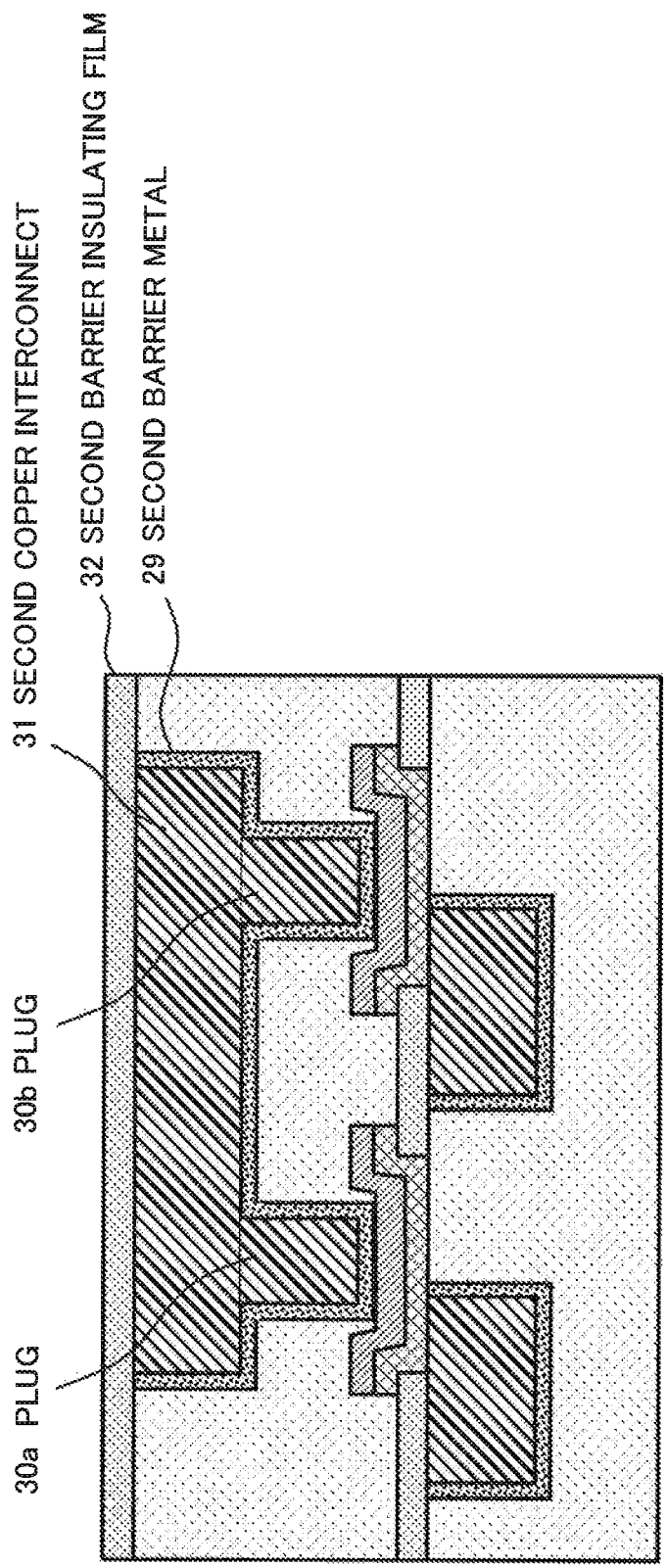

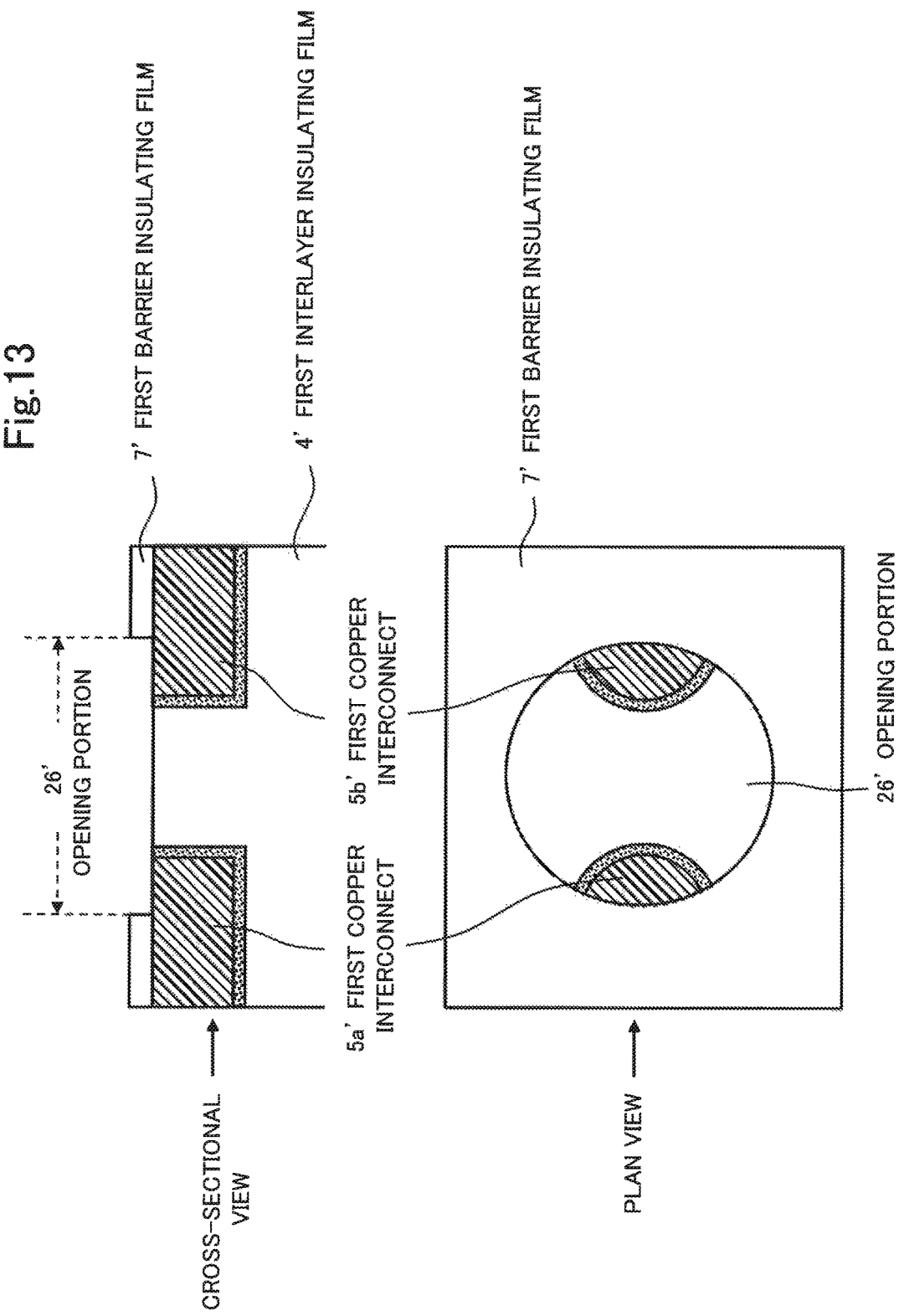

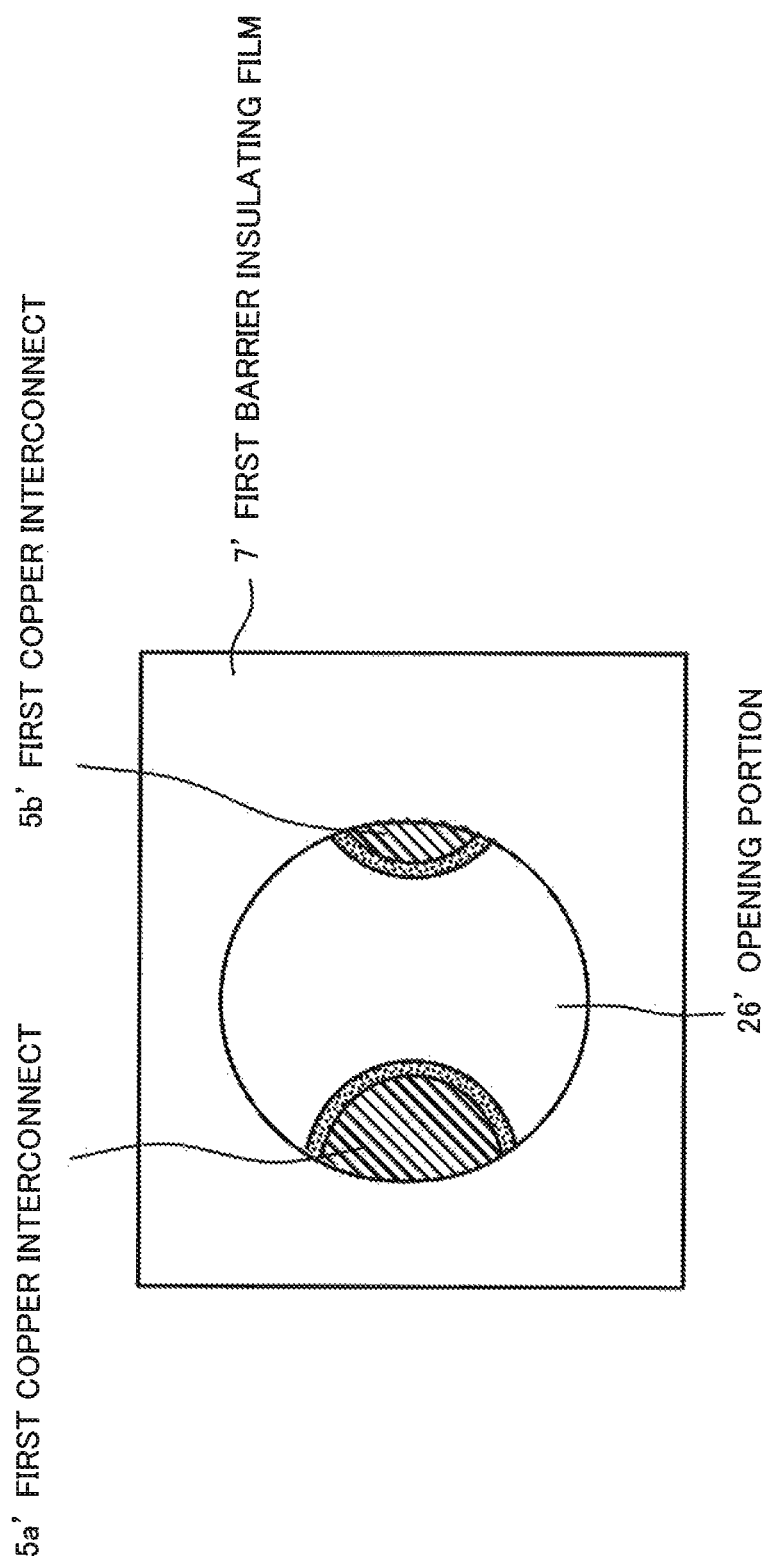

CROSSBAR SWITCH AND METHOD OF MANUFACTURING THE SAME AND SEMICONDUCTOR DEVICE

This application is a National Stage Entry of PCT/JP2016/004240 filed on Sep. 16, 2016, which claims priority from Japanese Patent Application 2015-186356 filed on Sep. 24, 2015, the contents of all of which are incorporated herein by reference, in their entirety.

TECHNICAL FIELD

The present invention relates to a metal deposition type resistance change element using metal ion transfer and electrochemical reaction and a semiconductor device using the same.

BACKGROUND ART

A resistance change element using metal ion transfer and electrochemical reaction in a resistance change film includes three layers of a copper electrode, a resistance change film, and an inert electrode. The copper electrode serves not only as an electrode, but also as a member to supply metal ion to the resistance change film. A material of the inert electrode is a metal which does not supply metal ion to the resistance change film. The term inert electrode means an electrode that does not contribute to reaction. When the copper electrode is grounded and a negative voltage is applied to the inert electrode, a metal of the copper electrode is converted into metal ion and is dissolved in the resistance change film. Then, the metal ion in the resistance change film is precipitated as a metal in the resistance change film and the precipitated metal forms a metal-bridge that connects the copper electrode and the inert electrode. By electrically connecting the copper electrode and the inert electrode with the metal-bridge, state of the resistance change element is translated from a high-resistive state to a low-resistive state.

On the other hand, when the copper electrode of the resistance change element in the low-resistive state described above is grounded and a positive voltage is applied to the inert electrode, the metal-bridge is dissolved in the resistance change film, and part of the metal-bridge is broken. Accordingly, electric connection between the copper electrode and the inert electrode by the metal-bridge is broken, and thus state of the resistance change element returns to the high-resistant state. Electric characteristics of the resistance change element changes such that the resistance between the copper electrode and the inert electrode increases or an inter-electrode capacitance varies, before a stage of the electric connection is completely broken. Finally, the electric connection therebetween is broken. The high-resistive state described above can be changed to the low-resistive state again by applying negative voltage to the inert electrode.

NPL 1 proposes a changeover switch in a programmable device using the resistance change element. By using the resistance change element, a switch area can be reduced to ⅓₀ that of switches of other types, and a switching resistance can be reduced to ¼₀. Moreover, the resistance change element may be integrated into a interconnect layer. Therefore, reduction in chip area and improvement of signal delay are expected.

PTL 1 and PTL 2 disclose methods of manufacturing the resistance change element in an integrated circuit.

PTL 1 discloses a method of integrating a resistance change element in a copper multilayer interconnect. According to PTL 1, one copper line out of the copper interconnect forms a copper electrode of the resistance change element, so that the copper interconnect works also as the copper electrode of the resistance change element. The configuration realize density increasing of the elements by miniaturizing the resistance change elements and manufacturing process simplifying. The resistance change elements can be mounted only by adding two photomasks to a normal copper damascene interconnect process. Consequently, it reduces the cost simultaneously. Further, it can improve the performance of an apparatus by mounting the resistance change element in a leading-edge device composed of the copper interconnect.

According to FIG. 3 of PTL 1, an opening portion that communicates with part of a first interconnect is formed by dry-etching an insulating barrier film, and resistance change element films are deposited so as to cover the exposed first interconnect. Subsequently, a configuration of the resistance change element is made by forming a first upper electrode and a second upper electrode.

PTL 2 also discloses a method of integrating a resistance change element in a copper multilayer interconnect. In FIG. 17 of PTL 2, an opening portion is provided in an insulating barrier film to expose parts of upper surfaces of the copper interconnect (first interconnects 5a, 5b), and a resistance change element film, a first upper electrode and a second upper electrode are formed on the copper interconnect. Here, the opening portion is provided to expose one end of each of the copper interconnects, and the ends contact with the resistance change element film.

FIG. 12 illustrates a cross-sectional structure of a resistance change element disclosed in FIG. 11 of PTL 2. A first resistance change element includes the first copper interconnect 5a', a resistance change film 9', and an upper electrode 10'. A second resistance change element includes a first copper interconnect 5b', the resistance change film 9', and the upper electrode 10'. The first copper interconnects 5a', 5b' are covered with barrier metals 6a', 6b' except for upper surfaces thereof and are embedded in a first interlayer insulating film 4'. The upper surfaces of the first copper interconnects 5a', 5b' are covered with a first barrier insulating film 7', and are in contact with the resistance change film 9' via an opening portion 26' (illustrated in FIG. 13) provided in the first barrier insulating film 7'.

The resistance change film 9' covers the opening portion 26' of the first barrier insulating film 7' and is partly in contact with an upper surface of the first barrier insulating film 7'. The resistance change film 9' is in contact with the upper electrode 10'. The upper electrode 10' is in contact with a copper-plug 19' covered with a barrier metal 20' on a surface thereof. The plug 19' is in contact with a second copper interconnect 18'. The plug 19' and the second copper interconnect 18' are embedded in a second interlayer insulating film 15', and an upper surface of the second copper interconnect 18' is covered with a second barrier insulating film 21'.

FIG. 13 illustrates a cross-sectional view and a plane view of a step of opening the first barrier insulating film 7' for manufacturing a structure illustrated in FIG. 12. In the step of forming the opening portion 26', a contact area between the resistance change film 9' and the first copper interconnect 5a' is preferable equivalent to a contact area between the resistance change film 9' and the first copper interconnect 5b'.

Electric characteristics of a device with the structure in FIG. 12 and a photograph of the opening portion are disclosed in NPL 2. According to the electric characteristics disclosed in NPL 2, two sets of resistance change elements are referred to as a complementary resistance change element (complementary atom switch, CAS), and high OFF-state reliability is achieved while reducing a program voltage. The program voltage is a voltage when the resistance of the resistance change element changes from the high-resistive state to the low-resistive state, and is preferably not higher than 2V. In the case where the resistance change element is applied to a programmable logic described in NPL1, the resistance is required not to vary even when an operation voltage (1V, for example) of the integrated circuit is applied. In other words, the high OFF-state reliability is required, such that ensures no variation of high-resistive state to the low-resistive state occur even when a voltage of 1V continuously applied to the element for 10 years. The 1V corresponds to the operation voltage of an integrated circuit and 10 years corresponds to a life of the integrated circuit. The complementary atom switch solves the subject described above by the following method.

The metal deposition type resistance change element has a bipolar feature. The following is a description of a case where two resistance change elements in a high-resistive state are connected in series in an opposite direction and a voltage is applied to both ends. Here, the term "connected in series in the opposite direction" indicates connecting two inert electrodes of two resistance change elements or two copper electrodes of two resistance change elements. In FIG. 12, the upper electrode 10', which corresponds to the inert electrode is shared, that is connected. When a voltage is applied between both ends, that is, the first copper interconnect 5a' and the second copper interconnect 5b', a voltage of a polarity which does not cause a resistance change is applied to one of the two resistance change elements irrespective of polarity of the voltage. In this configuration, it is reported that the high-resistive state may be maintained for 10 years or more even when applying 1V, which is the operation voltage of the integrated circuit (FIG. 16 in NPL 2).

It is also reported that the resistance varies by a low voltage, about 2V, by applying a voltage independently to each of the resistance change elements while programming the elements connected in series (FIG. 9(a) in NPL2). Contact of the end portions of the first copper interconnect 5a' and the first copper interconnect 5b' to the resistance change film 9' also contributes to reduction of a program voltage. The program voltage of the structure illustrated in FIG. 12, in which the resistance change film is in contact with the end portions, is lower than that of the structure in PTL 1 (FIG. 1 in PTL1), in which the resistance change film in contact with a flat portion of the copper interconnect. At the end portions of the copper interconnect, the shape of the copper is pointed. When the end of the electrode is pointed, concentration of electric field may occur. In other words, the electric field is intensified by the structure having the pointed end, generation or transfer of copper ion is activated, and a low program voltage is realized.

Techniques relating to the resistance change elements and semiconductor devices employing the resistance change elements are also disclosed in PTL 3, PTL 4, and PTL 5.

CITATION LIST

Patent Literature

[PTL1]: WO No. 2010/079827
[PTL2] WO No. 2011/158821
[PTL3]: Japanese Unexamined Patent Publication (Kokai) No. 2012-204399
[PTL4]: WO No. 2011-158887
[PTL5]: WO No. 2012-043502

Non Patent Literature

[NPL 1]: S. Kaeriyama, et al., "A nonvolatile Programmable Solid-Electrolyte Nanometer Switch", IEEE JOURNAL OF SOLID-STATE CIRCUITS, VOL. 40, NO. 1, pp. 168-176, 2005
[NPL 2]: M. Tada, T. Sakamoto, et al., "Highly Reliable, Complementary Atom Switch (CAS) with Low Programming Voltage Embedded in Cu BEOL for Nonvolatile Programmable Logic", IEDM, Technical Digest, pp. 689-692, 2011.

SUMMARY OF INVENTION

Technical Problem

The program voltage also depends on a contact area between the copper interconnect and the resistance change film. The larger the contact area, the higher the probability that the copper bridge is connected, and thus the lower the program voltage. Leak current in the high-resistive state also depends on the contact area. From such circumstances, the contact area between the copper interconnect and the resistance change film is required to be equal between the resistance change elements.

In a photograph of the opening portion in FIG. 7 of NPL2, surface areas of upper surfaces of the two copper interconnects exposed from the opening portions are substantially equivalent. In this manner, in order to maintain the surface areas of the exposed copper interconnects constant, improvement of accuracy of lithography that determines the position of the opening portion is required. The accuracy of the status quo is on the order from 10 nm to 30 nm with an immersion lithography. Therefore, the width of the copper interconnect at the opening portion 26' is reduced to 100 nm or smaller, variations of area of the exposed copper surface become significant, because of the positional displacement of the opening portion 26' as illustrated in FIG. 14. FIG. 14 illustrates a case where the opening portion 26' is shifted leftward when viewing the figure sheet. In association with miniaturization of the resistance change element, the effect of the displacement is increased. Therefore, variations in program voltage or leak current in the high-resistive state become an issue.

In the techniques disclosed in PTL 1 to PTL 5 and in NPL 1 and NPL2, there are no disclosures and suggestions relating to a structure and a method for solving such variations. Therefore, these techniques cannot reduce the variations of the program voltage and the leak current in the high-resistive state.

In view of such a problem described above, it is an object of the present invention to provide a metal deposition type resistance change element in which variations in program voltage and leak current in a high-resistive state are reduced while reducing the program voltage and a semiconductor device using the same.

Solution to Problem

A resistance change element of the present invention includes: a first insulating film provided on a semiconductor substrate on which transistor is formed; first and second electrodes embedded in the first insulating film and configured to supply metal ion; a second insulating film configured to cover the first insulating film and the first and second electrodes; first and second opening portions configured to expose parts of an upper surface including end portions of the first and second electrodes from the second insulating film with translational symmetry; metal deposition type first and second resistance change films configured to cover respectively the first and second opening portions and to be connected to the parts of the upper surface including the end portions of the first and second electrodes at the first and second opening portions; third and fourth electrodes connected respectively to upper surfaces of the first and second resistance change films; and a fifth electrode connected to the third and fourth electrodes and connected to a diffusion layer of the transistor.

A method of manufacturing the resistance change element of the present invention includes: forming a first insulating film on a semiconductor substrate including a transistor formed thereon; forming first and second electrodes configured to supply metal ion by embedding the first and second electrodes in the first insulating film; forming a second insulating film configured to cover the first insulating film and the first and second electrodes; forming first and second opening portions configured to expose respectively parts of an upper surface including end portions of the first and second electrodes from the second insulating film with translational symmetry; forming metal deposition type first and second resistance change films configured to cover respectively the first and second opening portions and to be connected to the parts of the upper surface including the end portions of the first and second electrodes at the first and second opening portions; forming third and fourth electrodes connected respectively to upper surfaces of the first and second resistance change films; and forming a fifth electrode connected to the third and fourth electrodes and connected to a diffusion layer of the transistor.

The semiconductor device of the present invention is a semiconductor device having the resistance change element of the present invention built into a multilayer copper interconnect of a semiconductor integrated circuit that has the multilayer copper interconnect.

Advantageous Effects of Invention

According to the present invention, a metal deposition type resistance change element in which variations in program voltage and leak current in a high-resistive state are reduced while reducing the program voltage and a semiconductor device using the same is manufactured.

BRIEF DESCRIPTION OF DRAWINGS

FIG. 4 illustrates a cross-sectional view and a plane view for explaining a structure of the resistance change element of the second embodiment of the present invention.

FIG. 8C is a cross-sectional view illustrating a method of manufacturing the resistance change element according to the second embodiment of the present invention.

FIG. 8D is a cross-sectional view illustrating a method of manufacturing the resistance change element according to the second embodiment of the present invention.

FIG. 8E is a cross-sectional view illustrating a method of manufacturing the resistance change element according to the second embodiment of the present invention.

FIG. 8F is a cross-sectional view illustrating a method of manufacturing the resistance change element according to the second embodiment of the present invention.

FIG. 13 illustrates a cross-sectional view and a plane view for explaining a structure of the resistance change element disclosed in PTL 2.

FIG. 14 is a plane view for explaining a structure of the resistance change element disclosed in PTL 2.

EXAMPLE EMBODIMENT

Figure 1:
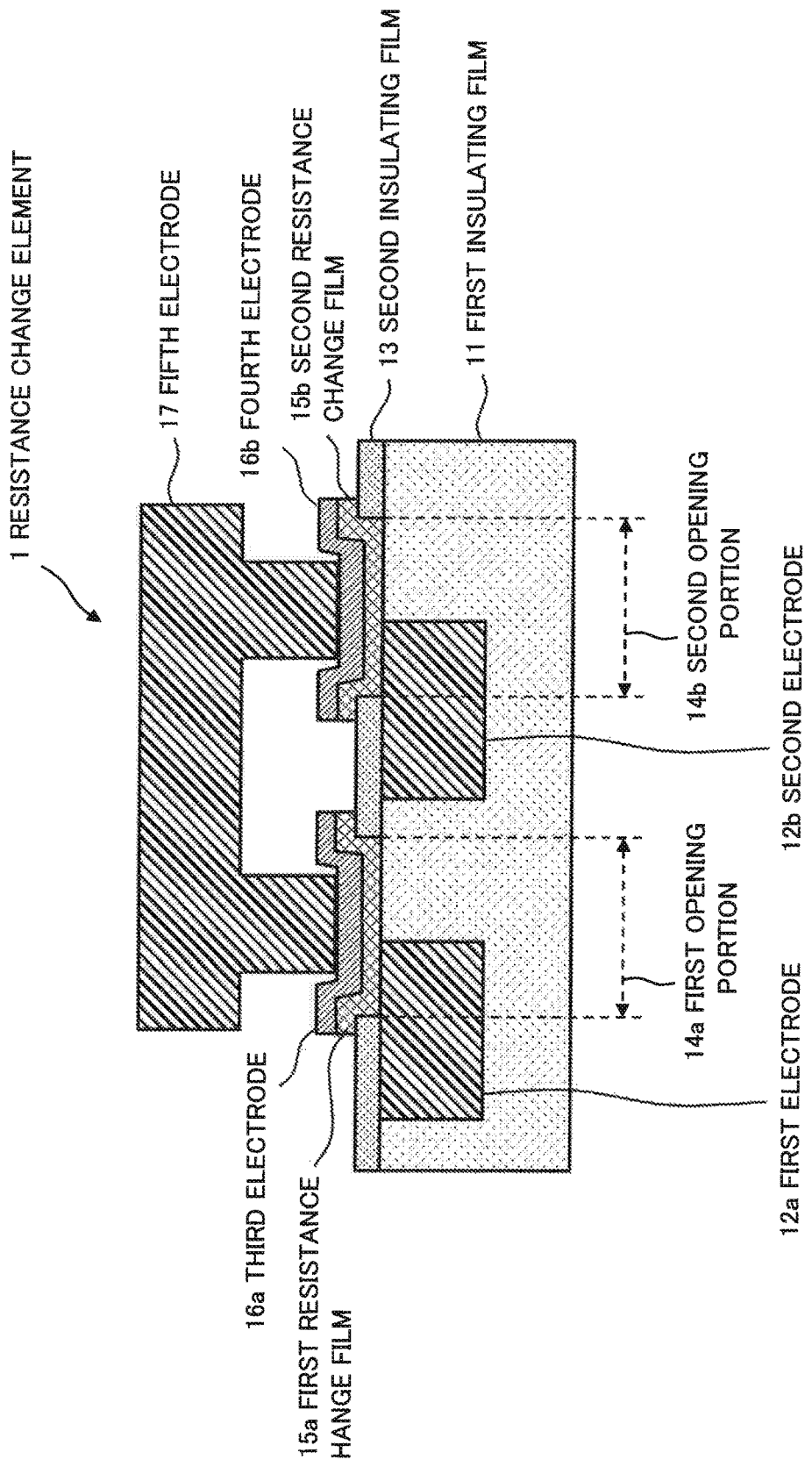
FIG. 1 is a cross-sectional view illustrating a structure of a resistance change element according to a first embodiment of the present invention.

Referring now to the drawings, embodiments of the present invention will be described in detail. However, in the embodiments described below, technically preferable limitations for implementing the present invention are provided. However, the scope of the present invention is not limited to the description given below.

A First Example Embodiment

FIG. 1 is a cross-sectional view illustrating a structure of a resistance change element according to a first embodiment of the present invention. A resistance change element 1 of this embodiment includes a first insulating film 11 provided on a semiconductor substrate provided with a transistor formed thereon, and a first electrode 12a and a second electrode 12b embedded in the first insulating film 11. The resistance change element 1 further includes a second insulating film 13 covering the first insulating film 11, the first electrode 12a and the second electrode 12b. Second insulating film 13 has a first opening portion 14a and a second opening portion 14b configured to expose parts of an upper surface including end portions of the first electrode 12a and the second electrode 12b with translational symmetry. The resistance change element 1 further includes a first resistance change film 15a and a second resistance change film 15b of a metal deposition type configured to cover the first opening portion 14a and the second opening portion 14b respectively. The first resistance change film 15a and the second resistance change film 15b connect to the parts of the upper surface of the first electrode 12a and the second electrode 12b at the first opening portion 14a and the second opening portion 14b, the parts include the end portions of the first electrode 12a and the second electrode 12b. The first electrode 12a and the second electrode 12b supply metal ion to the resistance change film 15a and the resistance change film 15b, respectively. The resistance change element 1 further includes a third electrode 16a and a fourth electrode 16b connecting respectively to the upper surfaces of the first resistance change film 15a and the second resistance change film 15b. The resistance change element 1 further includes a fifth electrode 17 connected to the third electrode 16a and the fourth electrode 16b and connected to a diffusion layer of the transistor.

A method of manufacturing the resistance change element 1 of this embodiment includes forming the first insulating film 11 on a semiconductor substrate including a transistor formed thereon, and forming the first electrode 12a and the second electrode 12b by embedding in the first insulating film 11. The first electrode 12a and the second electrode 12b configured to supply metal ion. Further, the method includes forming the second insulating film 13 covering the first insulating film 11, the first electrode 12a and the second electrode 12b. The method further includes forming the first opening portion 14a and the second opening portion 14b respectively exposing parts of upper surface including the end portions of the first electrode 12a and the second electrode 12b from the second insulating film 13 with translational symmetry. The method further includes forming the first resistance change film 15a and the second resistance change film 15b of a metal deposition type covering the first opening portion 14a and the second opening portion 14b respectively. The first resistance change film 15a and the second resistance change film 15b connect to the parts of the upper surface of the first electrode 12a and the second electrode 12b at the first opening portion 14a and the second opening portion 14b, the parts include the end portions of the first electrode 12a and the second electrode 12b. The method further includes forming a third electrode 16a and a fourth electrode 16b connecting respectively to the upper surfaces of the first resistance change film 15a and the second resistance change film 15b. The method further includes forming a fifth electrode 17 connected to the third electrode 16a and the fourth electrode 16b and connected to the diffusion layer of the transistor.

Figure 2:
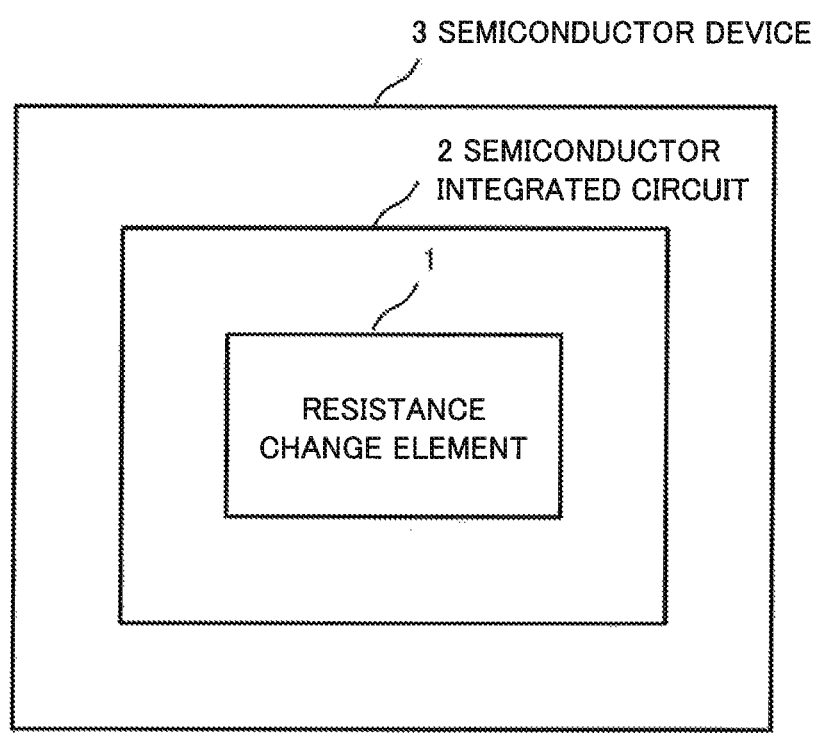
FIG. 2 is a block diagram illustrating a configuration of a semiconductor device using the resistance change element according to the first embodiment of the present invention.

FIG. 2 is a block diagram illustrating a configuration of a semiconductor device which includes the resistance change element 1 according to the embodiment built therein. The semiconductor device 3 of the embodiment is a semiconductor device having the resistance change element 1 built into a multilayer copper interconnect of a semiconductor integrated circuit 2 that has the multilayer copper interconnect.

According to this embodiment, the metal deposition type resistance change element whose variations in program voltage and leak current in a high-resistive state are reduced while reducing the program voltage, and the semiconductor device using the same is manufactured.

A Second Example Embodiment

Figure 3:
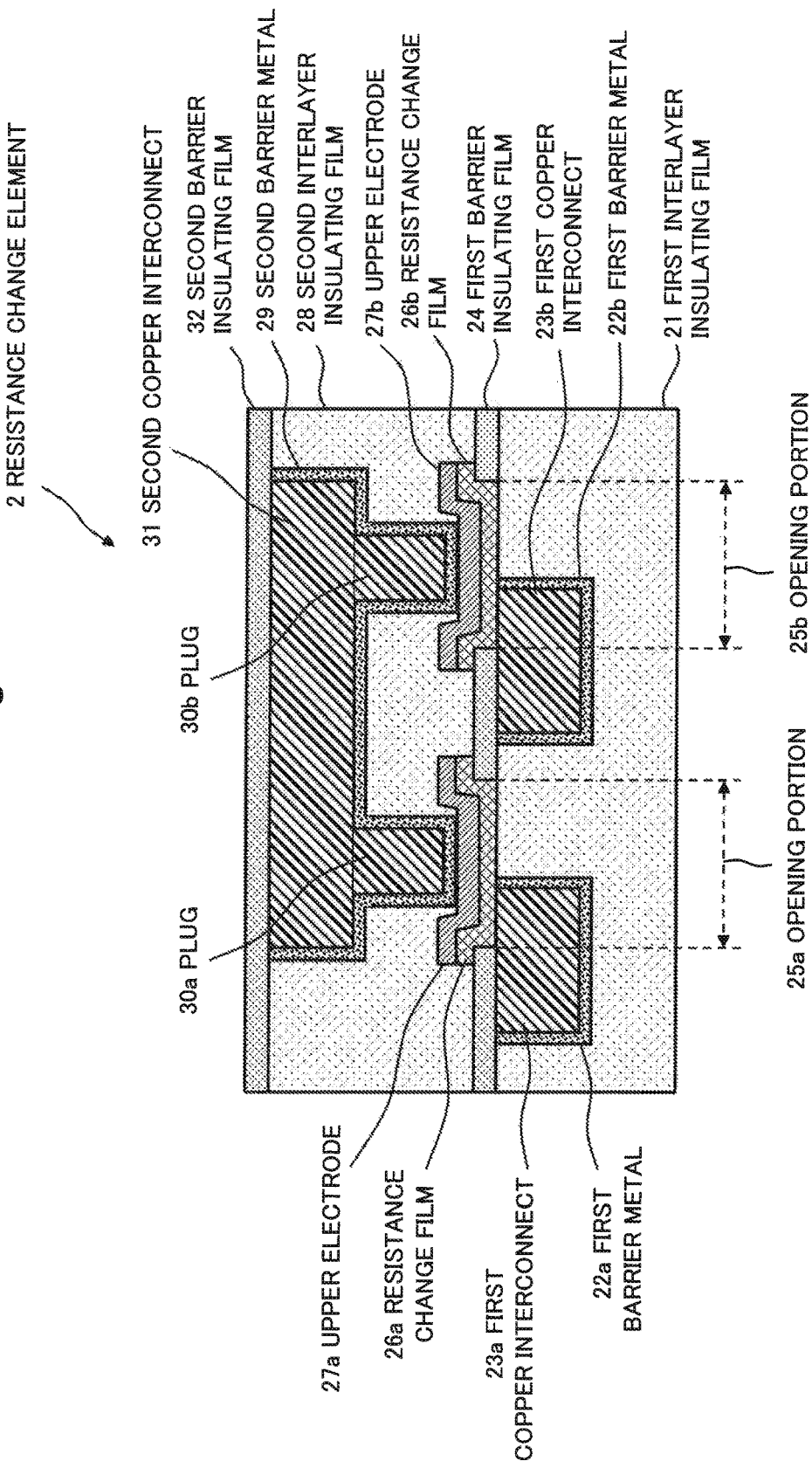
FIG. 3 is a cross-sectional view illustrating a structure of a resistance change element according to a second embodiment of the present invention.

FIG. 3 is a cross-sectional view illustrating a structure of a resistance change element according to a second embodiment of the present invention. The resistance change element 2 of this embodiment includes first copper interconnects 23a, 23b which are electrodes for supplying metal ion to resistance change films 26a, 26b; a first barrier insulating film 24; the resistance change films 26a, 26b; and upper electrodes 27a, 27b which are inert electrodes which do not supply metal ion. The resistance change element 2 has a structure of a complementary resistance change element.

The first copper interconnects 23a, 23b are embedded in a first interlayer insulating film 21 formed on a semiconductor substrate (not illustrated) including a transistor formed thereon, and are covered on side surfaces and bottom surfaces thereof with first barrier metals 22a, 22b. The first copper interconnects 23a, 23b may be configured as part of the multilayer copper interconnect of the semiconductor integrated circuit. Parts of the upper surface including the end portions of the first copper interconnect 23a and the first copper interconnect 23b are exposed respectively from the first barrier insulating film 24 through an opening portion 25a and an opening portion 25b of the first barrier insulating film 24 with translational symmetry and connect to the resistance change films 26a, 26b.

The resistance change films 26a, 26b connect to the upper electrodes 27a, 27b. The upper electrodes 27a, 27b connect to plugs 30a, 30b covered at the bottom surfaces and the side surfaces with the second barrier metal 29. The plugs 30a, 30b connect to a second copper interconnect 31. Side surfaces and parts of a bottom surface of the second copper interconnect 31 are covered with the second barrier metal 29, the parts of the bottom surface are not in contact with the plugs 30a, 30b.

The second copper interconnect 31 connect to the diffusion layer of the transistor (illustration is omitted). The diffusion layer is, for example, a drain electrode of the transistor. As another mode, the second copper interconnect 31 may connect to an electrode of a diode formed on the semiconductor substrate.

The second copper interconnect 31, the plugs 30a, 30b, the upper electrodes 27a, 27b, and the resistance change films 26a, 26b are embedded in a second interlayer insulating film 28. The second interlayer insulating film 28 and the second copper interconnect 31 are covered with a second barrier insulating film 32. The second copper interconnect 31 and the plugs 30a, 30b may serve as part of the multilayer copper interconnect of the semiconductor integrated circuit.

FIG. 4 illustrates a cross-sectional view (A-A' cross section) and a plane view for explaining positions of the opening portions 25a, 25b of the first barrier insulating film 24 of the resistance change element 2. The opening portions 25a, 25b are provided by removing parts of the first barrier insulating film 24 covering the first copper interconnects 23a, 23b, the first barrier metals 22a, 22b, and the first interlayer insulating film 21 by etching. The opening portions 25a, 25b are provided so as to expose parts of an upper surface including the end portions of the first copper interconnects 23a, 23b.

At this time, the parts of the upper surface including the end portions of the first copper interconnect 23a and the first copper interconnect 23b exposed respectively from the opening portions 25a, 25b have translational symmetry. Accordingly, the surface areas of the parts of the upper surface including the end portions of the first copper interconnect 23a and the first copper interconnect 23b connected to the resistance change film 26a and the resistance change film 26b are equivalent. Consequently, variations in program voltage and leak current in a high-resistive state may be reduced. In addition, as the end portions of the first copper interconnects 23a, 23b connect to the resistance change films 26a, 26b, a reduction of the program voltage is achieved.

Note that although the case where terminal portions of interconnect of the first copper interconnects 23a, 23b are exposed is illustrated in FIG. 4, a case where end portions (line edges) of the first copper interconnects 23a, 23b at intermediate portions of interconnect are exposed is also applicable.

Figure 5A:
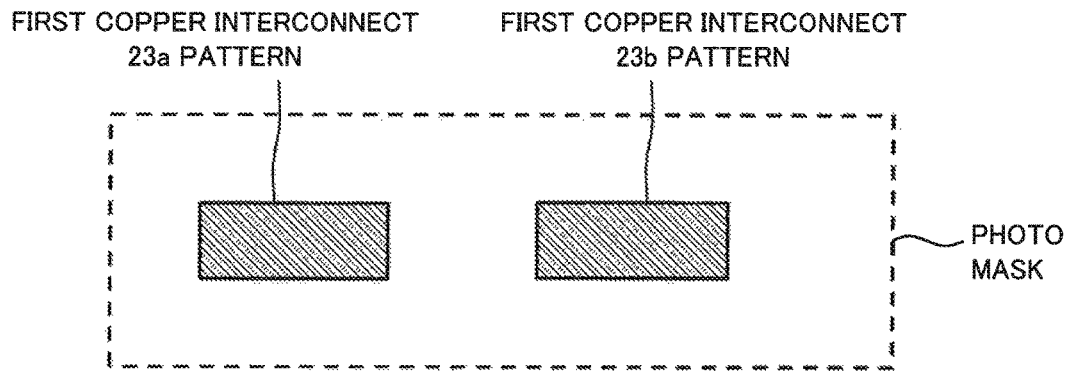
FIG. 5A is a drawing illustrating a layout (copper interconnect pattern) of a photo mask used in a lithography process for the resistance change element of the second embodiment of the present invention.
Figure 5B:
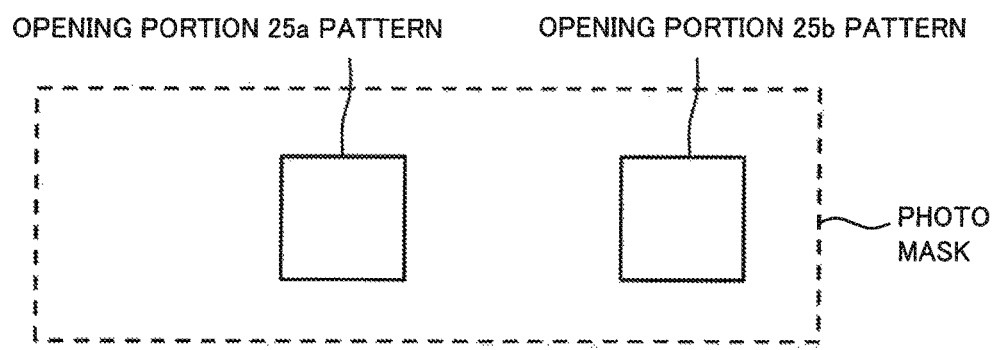
FIG. 5B is a drawing illustrating a layout (opening portion pattern) of the photo mask used in the lithography process for the resistance change element of the second embodiment of the present invention.
Figure 5C:
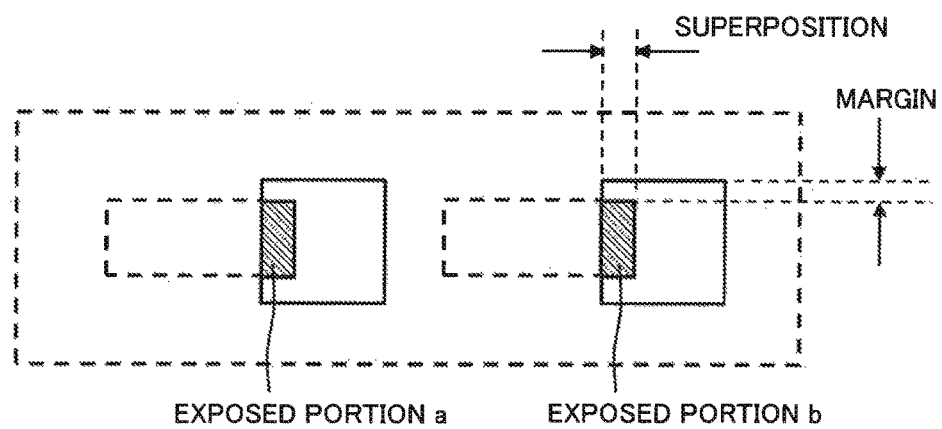
FIG. 5C is a drawing illustrating superposition of the patterns of the photo mask used in the lithography process for the resistance change element of the second embodiment of the present invention.

FIG. 5A is a drawing illustrating a layout of a pattern of the first copper interconnects 23a, 23b of a photo mask used in a lithography process for the resistance change element 2 of this embodiment. FIG. 5B is a drawing illustrating a layout of a pattern of the opening portions 25a, 25b of the photo mask used in the lithography process for the resistance change element 2. FIG. 5C is a drawing illustrating superposition of the pattern of the first copper interconnects 23a, 23b and the pattern of the opening portions 25a, 25b.

The exposed portions a, b generated by the superposition illustrated in FIG. 5C (parts of the upper surface including the end portions of the first copper interconnects 23a, 23b) connect to the resistance change films 26a, 26b. The areas which the exposed portions a, b connect to the resistance change films 26a, 26b determine the electric feature of the resistance change element 2, and the areas are specified by the superposition. A positional relationship between the first copper interconnect 23a and the first copper interconnect 23b, and a positional relationship between the opening portion 25a and the opening portion 25b are defined by the layouts of the photo mask which is illustrated respectively in FIG. 5A and FIG. 5B with high degree of accuracy.

On the other hand, a positional relationship between the first copper interconnect 23a and the opening portion 25a, and a positional relationship between the first copper interconnect 23b and the opening portion 25b depend on the accuracy of the superposition of lithography. In the case of immersion exposure apparatus, an error on the order from 10 nm to 30 nm occurs. For example, in the case of the arrangement as illustrated in FIG. 14 described above, the surface areas of the two copper interconnects exposed from the opening portions are different due to the error of the superposition. On the other hand, in this embodiment, the pattern of the first copper interconnect 23a and the first copper interconnect 23b are exposed simultaneously with the photo mask illustrated in FIG. 5A, and then the pattern of the opening portion 25a and the opening portion 25b are exposed simultaneously with the photo mask illustrated in FIG. 5B. Therefore, the exposed portion a and the exposed portion b obtained by these superposition have translational symmetry in an in-plane direction, and the surface areas of both become equivalent.

Note that a margin considering accuracy of the superposition of the exposure apparatus needs to be set as illustrated in FIG. 5C. For example, setting such as a line width of 100 nm for the pattern for the first copper interconnects 23a, 23b, squares of 200 nm on a side for the pattern of the opening portions 25a, 25b, superposition of 50 nm, and a margin of 50 nm is applicable.

Note that the shapes of the pattern of the first copper interconnects 23a, 23b and the pattern of the opening portions 25a, 25b after manufacture may have rounded corners due to an optical proximity effect at the time of lithography, and thus a correction (an proximity effect correction) is required. However, corners still remain rounded even after the correction. Therefore, the first copper interconnects 23a, 23b and the opening portions 25a, 25b are drawn to be rounded in a plane view of FIG. 4.

Figure 6A:
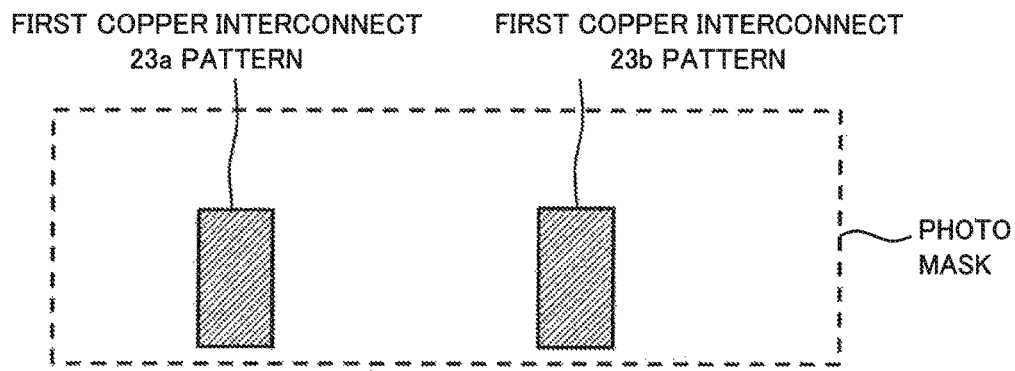
FIG. 6A is a drawing illustrating a layout (copper interconnect pattern) of the photo mask used in the lithography process for the resistance change element of the second embodiment of the present invention.
Figure 6B:
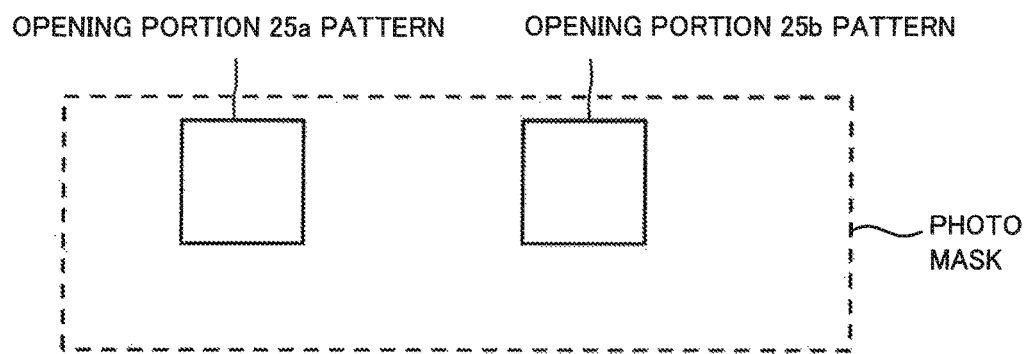
FIG. 6B is a drawing illustrating a layout (opening portion pattern) of the photo mask used in the lithography process for the resistance change element of the second embodiment of the present invention.
Figure 6C:
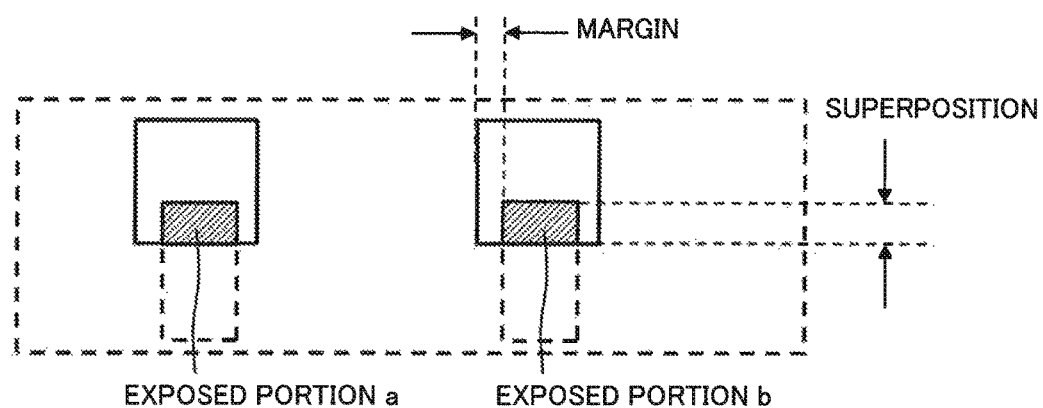
FIG. 6C is a drawing illustrating superposition of the patterns of the photo mask used in the lithography process for the resistance change element of the second embodiment of the present invention.
Figure 7A:
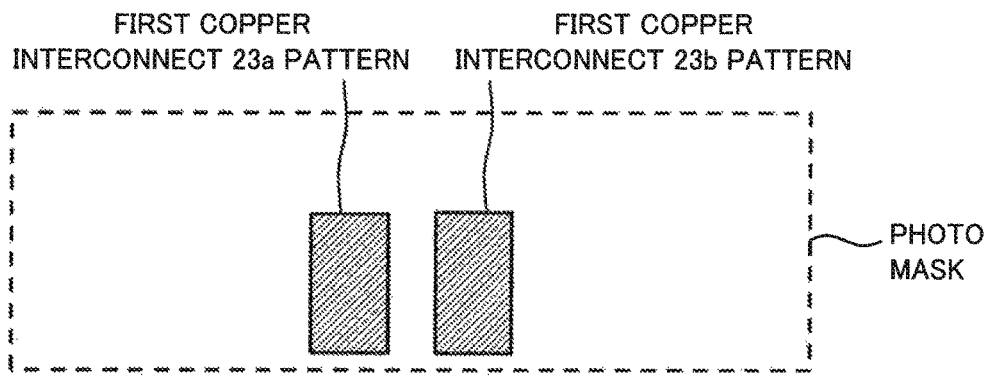
FIG. 7A is a drawing illustrating a layout (copper interconnect pattern) of the photo mask used in the lithography process for the resistance change element of the second embodiment of the present invention.
Figure 7B:
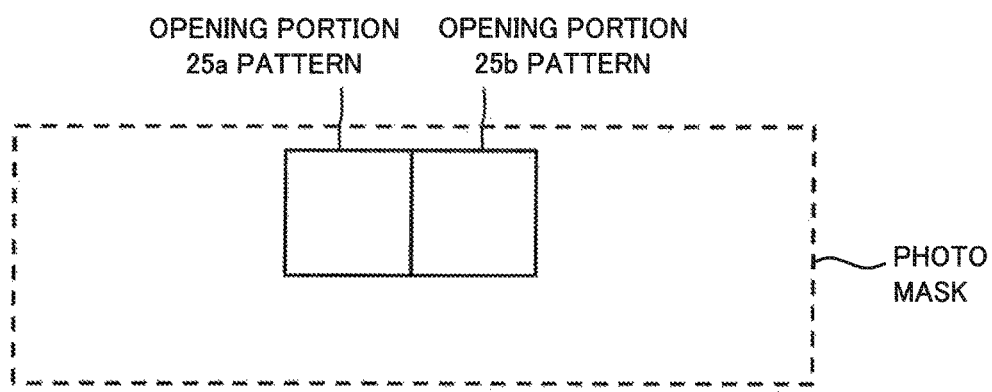
FIG. 7B is a drawing illustrating a layout (opening portion pattern) of the photo mask used in the lithography process for the resistance change element of the second embodiment of the present invention.
Figure 7C:
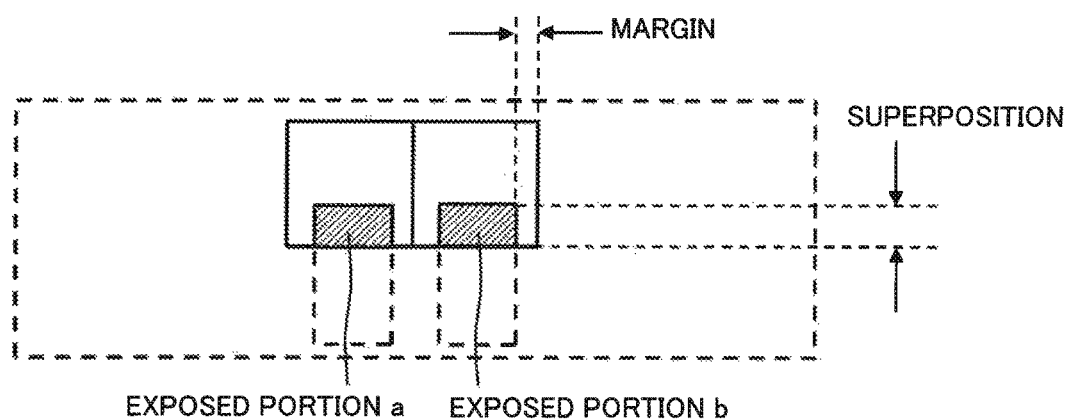
FIG. 7C is a drawing illustrating superposition of the patterns of the photo mask used in the lithography process for the resistance change element of the second embodiment of the present invention.

The layout of the pattern of the first copper interconnects 23a, 23b and the pattern of the opening portions 25a, 25b as illustrated in FIGS. 6A and 6B, and FIGS. 7A and 7B are also applicable in addition to those illustrated in FIGS. 5A and 5B. In the case of FIGS. 6A and 6B and FIGS. 7A and 7B, the exposed portion a and the exposed portion b, obtained by superimposing the photo masks, have translational symmetry in the in-plane direction as illustrated in FIG. 6C and FIG. 7C, and thus the surface areas of the exposed portion a and the exposed portion b become equivalent.

The structure of the resistance change element 2 may be manufactured by using the following materials.

The first interlayer insulating film 21 is formed on a substrate (illustration is omitted) including a semiconductor device such as a transistor and the like formed on a silicon substrate by using semiconductor manufacturing steps. The first interlayer insulating film 21 and the second interlayer insulating film 28 may be formed of a compound of silicon and oxygen and, more preferably, and may be formed of a low-dielectric constant insulating film formed by adding a given amount of hydrogen, fluorine, or carbon to a compound of silicon and oxygen.

The first barrier insulating film 24 and the second barrier insulating film 32 are formed respectively on the first interlayer insulating film 21 including the first copper interconnects 23a, 23b and on the second interlayer insulating film 28 including the second copper interconnect 31. The first barrier insulating film 24 and the second barrier insulating film 28 have not only an effect of preventing oxidation of copper contained in the copper interconnect but also an effect of preventing the copper from spreading into the interlayer insulating film during and after manufacture. For example, silicon carbide, silicon carbonitride, silicon nitride, and a laminated structure thereof may be used as the first barrier insulating film 24 and the second barrier insulating film 32.

The first barrier metals 22a, 22b and the second barrier metal 29 are, for example, tantalum nitride or tantalum or a laminated film thereof. The first barrier metals 22a, 22b and the second barrier metal 29 have an effect of preventing copper in the interconnect and the plug from diffusing into the interlayer insulating film. The thicknesses of tantalum nitride and tantalum may be on the order from 5 nm to 30 nm.

The material of the first copper interconnects 23a, 23b is a metal that is capable of supplying metal ion into the resistance change films 26a, 26b, and preferably is copper which is a material of the interconnect in the semiconductor integrated circuit. Copper is preferable as a material of the plugs 30a, 30b and the second copper interconnect 31.

The resistance change films 26a, 26b may be oxidized materials such as tantalum oxide and titanium oxide and chalcogenide materials such as copper sulfide and silver sulfide. For example, a switching element for programmable logic is preferably formed of an oxidized material, specifically, tantalum oxide. The reason why the oxidized material is suitable is that the switching voltage is higher than the logic voltage. Further, the reason why tantalum oxide is suitable is that the tantalum oxide has a durability of withstanding 1000 times or more number of times of repetition of switching, and thus is highly reliable. The thickness of the resistance change films 26a, 26b, which are ion conducting layers, is preferably from 5 nm to 20 nm. The thickness of 5 nm or smaller causes leak current when the power is OFF due to tunnel current or Schottky current. On the other hand, the thickness of 20 nm or larger increases the switching voltage to 10V or higher, so that the required voltage is increased.

The upper electrodes 27a, 27b are formed with the metal having a property that is hard to diffuse or ion-conduct in the resistance change film 26a, 26b. The upper electrodes 27a, 27b are preferably made of a metallic material having a smaller free energy of oxidation in absolute value than a metal component in the resistance change element films 26a, 26b (for example, tantalum). For example, ruthenium, platinum, and ruthenium alloy may be used for the upper electrodes 27a, 27b.

The structure of the resistance change element 2 may be manufactured by the following manufacturing steps (FIG. 8A to FIG. 8F).

Figure 8A:
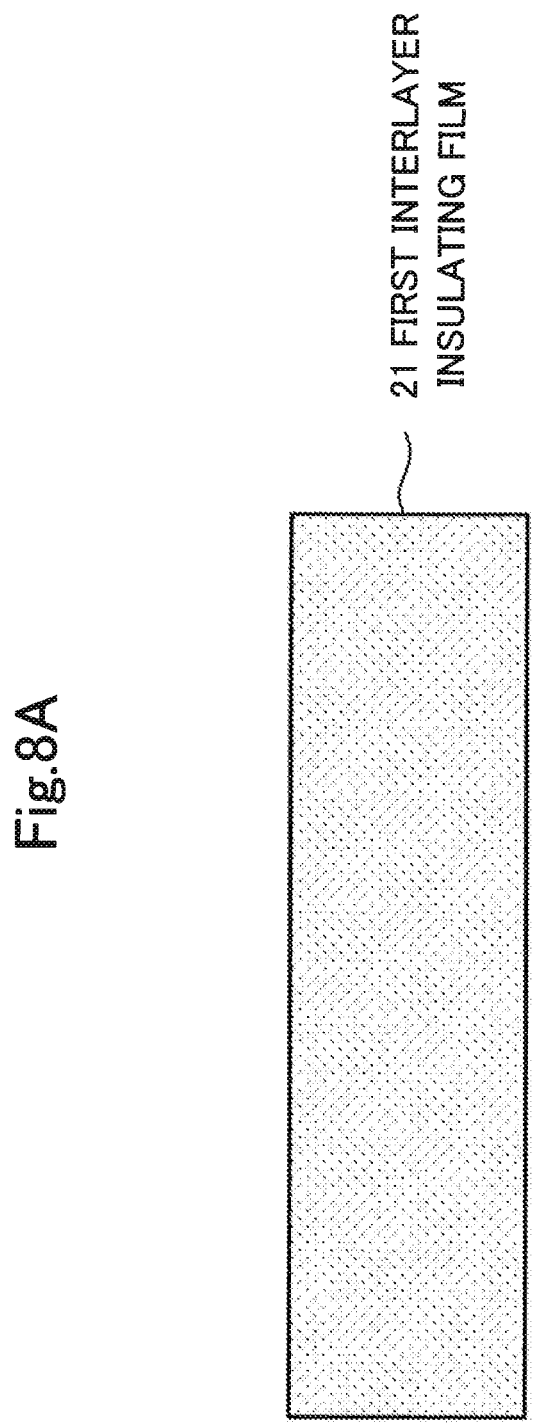
FIG. 8A is a cross-sectional view illustrating a method of manufacturing the resistance change element according to the second embodiment of the present invention.

[Step 1] (Forming Interlayer Insulating Film: FIG. 8A) A substrate (illustration is omitted) including a semiconductor device or the like such as a transistor formed on a silicon substrate by using semiconductor manufacturing steps is provided. A silicon nitride film is formed on the substrate as the first interlayer insulating film 21 by Chemical Vapor Deposition (hereinafter, abbreviated as CVD) method.

Figure 8B:
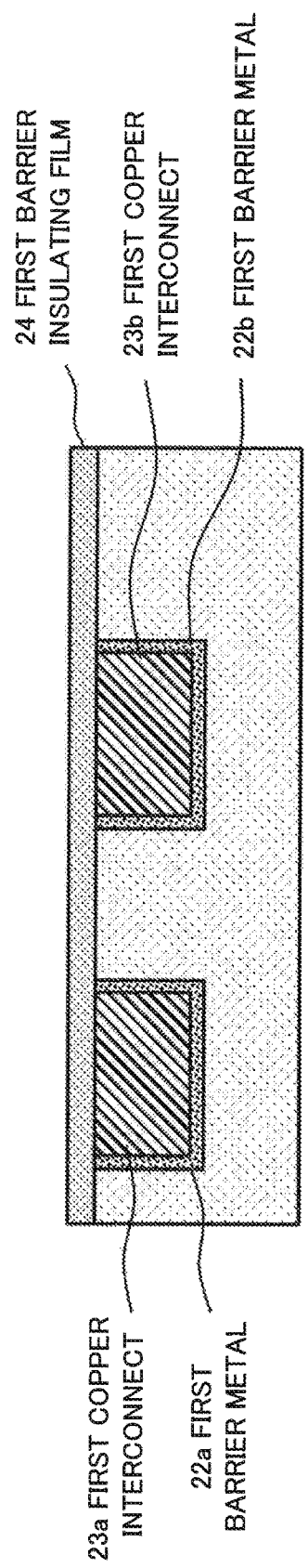
FIG. 8B is a cross-sectional view illustrating a method of manufacturing the resistance change element according to the second embodiment of the present invention.

[Step 2] (Forming Interconnect: FIG. 8B) An opening portion where the first copper interconnects 23a, 23b are to be embedded is formed in the first interlayer insulating film 21 by using photolithography technique and etching technique. First barrier metals 22a, 22b and a copper seed layer are formed in the formed opening portion by the CVD method. The first barrier metals 22a, 22b may be tantalum nitride having a thickness of 10 nm. The copper seed layer has a thickness on the order from 10 nm to 100 nm, and a small amount of impurity, for example, aluminum is added to be contained therein. Subsequently, electrolytic plating of copper is performed on the copper seed layer. A thickness of copper may be on the order of 800 nm to 1200 nm. Subsequently, useless parts of barrier metal and copper out of the opening portion are ground and removed by Chemical Mechanical Polishing (hereinafter, referred to as CMP) method.

Further, a silicon carbonitride having a thickness of 50 nm is formed as the first barrier insulating film 24 that covers the first interlayer insulating film 21, the first barrier metals 11a, 22b, and the first copper interconnects 23a, 23b by a sputtering method or the CVD method.

Further, the impurity in the copper seed layer is diffused over the entire part of the first copper interconnects 23a, 23b by performing a thermal treatment. The thermal treatment improves electromigration resistance of the first copper interconnects 23a, 23b. Since the first copper interconnects 23a, 23b and the first barrier metals 22a, 22b are covered with the first barrier insulating film 24, which prevents oxidation of copper contained in the copper interconnect during the thermal treatment, and manufacturing yield may be increased.

[Step 3] (Opening Portion of Barrier Insulating Film: FIG. 8C) The opening portions 25a, 25b of the first barrier insulating film 24 are formed by using the photolithography technique and the etching technique. The opening portions 25a, 25b expose the parts of the upper surface including the end portions of the first copper interconnects 23a, 23b from the opening portions 25a, 25b with translational symmetry. With the configuration of the translational symmetry, as the surface areas of the parts of the upper surface including the respective end portions of the first copper interconnects 23a, 23b connected to the resistance change films 26a, 26b become equivalent. Consequently, the variations in program voltage and the leak current in a high-resistive state may be reduced, and hence the manufacturing yield may be increased. In addition, as the end portions of the first copper interconnects 23a, 23b connect to the resistance change films 26a, 26b, a reduction of the program voltage is achieved.

[Step 4](Forming Resistance Change Film and Upper Electrode: FIG. 8D) Tantalum oxide having a thickness of 15 nm is formed as the resistance change films 26a, 26b and ruthenium having a thickness of 50 nm is formed as the upper electrodes 27a, 27b by the sputtering method or the CVD method. By using the photolithography technique and the etching technique, the opening portions 25a, 25b are covered, and the resistance change films 26a, 26b and the upper electrodes 27a, 27b are formed into a shape that covers part of the first barrier insulating film 24.

[Step 5] (Forming Interlayer Insulating Film: FIG. 8E) A silicon oxide film is formed as the second interlayer insulating film 28 by the CVD method. Here, a level difference exists on a surface of the silicon oxide film due to a level difference of the resistance change films 26a, 26b and the upper electrodes 27a, 27b, the level difference is flattened by the CMP method. A thickness of the second interlayer insulating film 28 may be on the order of 600 nm.

[Step 6](Forming Connection Plug and Interconnect: FIG. 8F) The opening portion where the plugs 30a, 30b and the second copper interconnect 31 are embedded is formed in the second interlayer insulating film 28 by using the photolithography technique and the etching technique. The second barrier metal 29 and the copper seed layer, which corresponds to part of the copper, are formed in the formed opening portion by the sputtering method or the CVD method. The second barrier metal 29 may be tantalum nitride having a thickness of 10 nm. A thickness of the copper seed layer may be on the order of 10 nm to 100 nm. Subsequently, the copper plating is performed on the copper seed layer. The thickness of the copper may be on the order of 800 nm to 1200 nm. Subsequently, the plugs 30a, 30b and the second copper interconnect 31 are formed by removing useless part of the barrier metal and copper formed out of the opening portion are ground by the CMP method. Next, a silicon carbonitride having a thickness of 50 nm that corresponds to the second barrier insulating film 32 is formed by the sputtering method or the CVD method.

In the manufacturing method described above, the material or the thickness of each layer may be changed variously within a range that ensures the function as the resistance change element.

Figure 9:
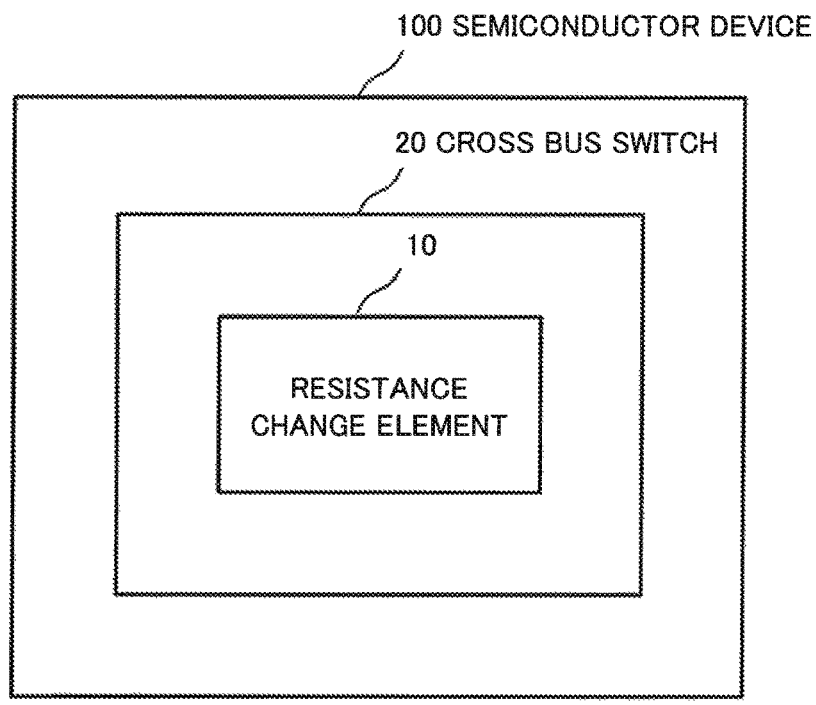
FIG. 9 is a block diagram illustrating a configuration of a semiconductor device using the resistance change element according to the second embodiment of the present invention.

FIG. 9 is a block diagram illustrating a configuration of a semiconductor device using the resistance change element according to this embodiment. A semiconductor device 100 of the embodiment is a semiconductor device including a crossbar switch 20 having a resistance change element 10 built into a multilayer copper interconnect of a semiconductor integrated circuit that has the multilayer copper interconnect. A programmable logic circuit provided with the crossbar switch 20 may be employed as the semiconductor integrated circuit. These semiconductor apparatus 100 may have a package that protects the semiconductor integrated circuit.

Figure 10:
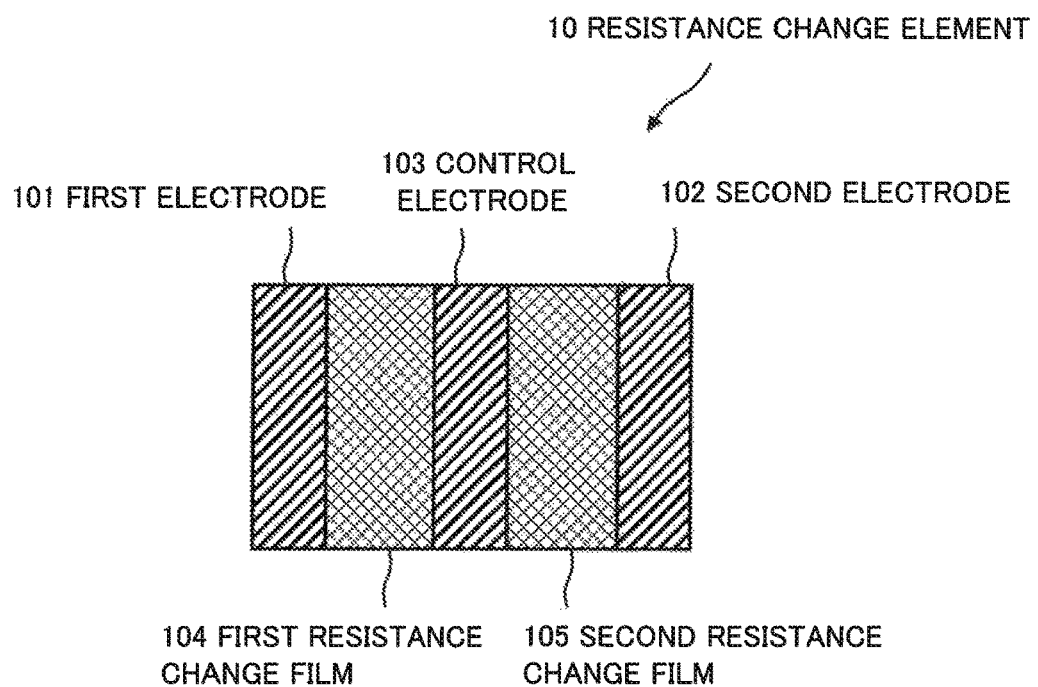
FIG. 10 is a schematic view illustrating a configuration of a complementary resistance change element according to the second embodiment of the present invention.

FIG. 10 is a schematic view illustrating a configuration of a complementary resistance change element 10 of the embodiment used in the crossbar switch 20. When the schematic view in FIG. 10 is made correspondent to the cross-sectional view in FIG. 3, a first electrode 101 corresponds to the first copper interconnect 23a, and a second electrode 102 corresponds to the first copper interconnect 23b. A control electrode 103 includes, the upper electrode 27a, the second barrier metal 32, the plug 30a, the second copper interconnect 31, the plug 30b, the second barrier metal 32, and the upper electrode 27b in this order. The second copper interconnect 31 connects to the diffusion layer of the transistor, and thus the control electrode 103 controls switching of the resistance change element 10. The first resistance change film 104 corresponds to the resistance change film 26a and a second resistance change film 105 corresponds to the resistance change film 26b.

Figure 11:
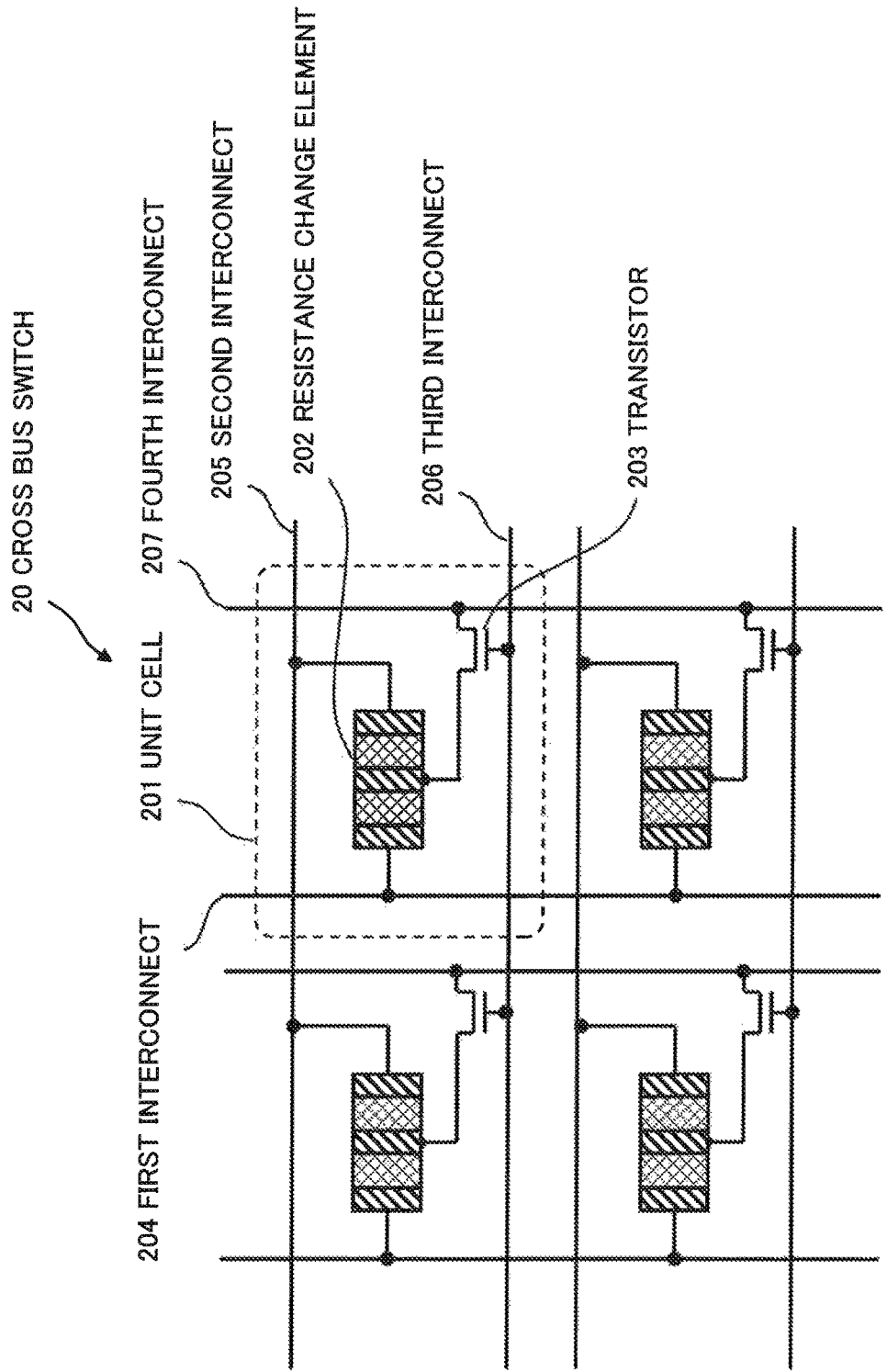
FIG. 11 is a drawing illustrating a configuration of a crossbar switch using the complementary resistance change element according to the second embodiment of the present invention.
Figure 12:
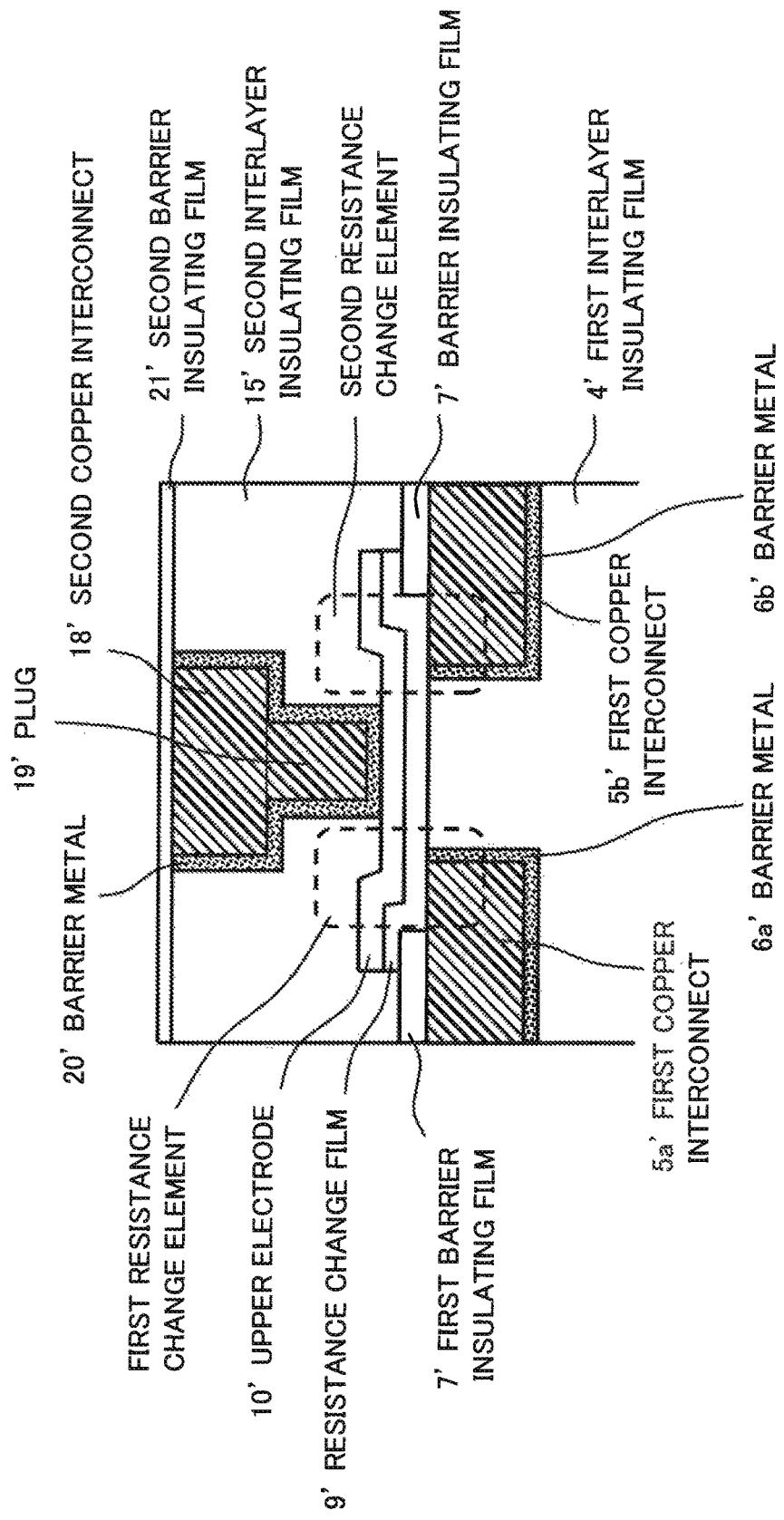
FIG. 12 is a cross-sectional view illustrating a structure of a resistance change element disclosed in PTL 2.

FIG. 11 is a drawing illustrating a configuration of the crossbar switch 20 using the complementary resistance change element 10. A unit cell 201 includes a single resistance change element 202 and a single transistor 203. The first electrode 101 connects to a first interconnect 204, the second electrode 102 connects to a second interconnect 205, and the control electrode 103 connects to a drain of the transistor 203, respectively. A gate of the transistor 203 connects to a third interconnect 206, and a source connects to a fourth interconnect 207, respectively. Routing of a signal in the programmable logic circuit is possible with the crossbar switch 20.

As described thus far, according to this embodiment, manufactures of a metal deposition type resistance change element in which variations in program voltage and leak current in a high-resistive state is reduced while reducing the program voltage and a semiconductor device using the same are achieved.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

The whole or part of the example embodiments disclosed above can be described as, but not limited to, the following supplementary notes.

(Supplementary Note 1)

A resistance change element including:

a first insulating film provided on a semiconductor substrate formed on a transistor;

first and second electrodes embedded in the first insulating film and configured to supply metal ion;

a second insulating film configured to cover the first insulating film and the first and second electrodes;

first and second opening portions configured to expose parts of an upper surface including end portions of the first and second electrodes from the second insulating film with translational symmetry;

metal deposition type first and second resistance change films configured to cover respectively the first and second opening portions and to be connected to the parts of the upper surface including the end portions of the first and second electrodes at the first and second opening portions;

third and fourth electrodes connected respectively to upper surfaces of the first and second resistance change films; and a fifth electrode connected to the third and fourth electrodes and connected to a diffusion layer of the transistor.

(Supplementary Note 2)

The resistance change element according to Supplementary note 1, wherein the resistance change film includes at least one of tantalum oxide, titanium oxide, copper sulfide, silver sulfide, and silicon oxide.

(Supplementary Note 3)

The resistance change element according to Supplementary note 1 or 2, wherein the first and second electrodes include copper.

(Supplementary Note 4)

The resistance change element according to any one of Supplementary notes 1 to 3, wherein the first and second electrodes include a copper interconnect in a multilayer copper interconnect of a semiconductor integrated circuit.

(Supplementary Note 5)

The resistance change element according to any one of Supplementary notes 1 to 4, wherein the third and fourth electrodes include at least one of ruthenium and platinum.

(Supplementary Note 6)

A method of manufacturing a resistance change element comprising:

forming a first insulating film on a semiconductor substrate including a transistor formed thereon;

forming first and second electrodes configured to supply metal ion by embedding the first and second electrodes in the first insulating film;

forming a second insulating film configured to cover the first insulating film and the first and second electrodes;

forming first and second opening portions configured to expose respectively parts of an upper surface including end portions of the first and second electrodes from the second insulating film with translational symmetry;

forming metal deposition type first and second resistance change films configured to cover respectively the first and second opening portions and to be connected to the part of the upper surface including the end portions of the first and second electrodes at the first and second opening portions;

forming third and fourth electrodes connected respectively to upper surfaces of the first and second resistance change films; and forming a fifth electrode connected to the third and fourth electrodes and connected to a diffusion layer of the transistor.

(Supplementary Note 7)

The method of manufacturing a resistance change element according to Supplementary note 6, wherein the first and second electrodes are exposed with a pattern on an identical photomask and the first and second opening portions are exposed with a pattern on another identical photomask.

(Supplementary Note 8)

The method of manufacturing a resistance change element according to Supplementary note 6 or 7, wherein the resistance change film includes at least one of tantalum oxide, titanium oxide, copper sulfide, silver sulfide, and silicon oxide, (Supplementary Note 9)

The method of manufacturing a resistance change element according to any one of Supplementary notes 6 to 8, wherein the first and second electrodes include copper.

(Supplementary Note 10)

The method of manufacturing a resistance change element according to any one of Supplementary notes 6 to 9, wherein the first and second electrodes include a copper interconnect in a multilayer copper interconnect of a semiconductor integrated circuit.

(Supplementary Note 11)

The method of manufacturing a resistance change element according to any one of Supplementary notes 6 to 10, wherein the third and fourth electrodes include at least one of ruthenium and platinum.

(Supplementary Note 12)

A semiconductor device including the resistance change element according to any one of Supplementary notes 1 to 5 built into a multilayer copper interconnect of a semiconductor integrated circuit that has the multilayer copper interconnect.

This application claims priority to Japanese Patent Application No. 2015-186356 filed in Sep. 24, 2015, the entire contents of which are incorporated herein by reference.

REFERENCE SIGNS LIST 1, 2, 10 resistance change element
2 semiconductor integrated circuit
3, 100 semiconductor device
11 first insulating film
12a first electrode
12b second electrode
13 second insulating film
14a first opening portion
14b second opening portion
15a first resistance change film
15b second resistance change film
16a third electrode
16b fourth electrode
17 fifth electrode
21 first interlayer insulating film
22a, 22b first barrier metal
23a, 23b first copper interconnect
24 first barrier insulating film
25a, 25b opening portion
26a, 26b resistance change film
27a, 27b upper electrode
28 second interlayer insulating film
29 second barrier metal
30a, 30b plug
31 second copper interconnect
101 first electrode
102 second electrode
103 control electrode
104 first resistance change film
105 second resistance change film
20 crossbar switch
201 unit cell
202 resistance change element
203 transistor
204 first interconnect
205 second interconnect
206 third interconnect
207 fourth interconnect

What is claimed is:

1. A crossbar switch comprising:
a first interconnect, a second interconnect, and a complementary resistance change element, wherein the complementary resistance change element comprises:
a first insulating film provided on a semiconductor substrate formed on a transistor;
first and second electrodes embedded in the first insulating film and configured to supply a metal ion;
wherein the first electrode is connected to the first interconnect and the second electrode connected to the second interconnect;
a second insulating film configured to cover the first insulating film and the first and second electrodes;
first and second opening portions configured to expose part of an upper surface including an end portion of the first electrode from the second insulating film and expose part of an upper surface including an end portion of the second electrode from the second insulating film, the exposed part of the upper surface of the first electrode and the exposed part of the upper surface of the second electrode being in a translational symmetry relation;
metal deposition type first and second resistance change films configured to cover respectively the first and second opening portions and to be connected to the exposed parts of the respective upper surfaces including the respective end portions of the respective first and second electrodes at the respective first and second opening portions;
third and fourth electrodes connected respectively to upper surfaces of the first and second resistance change films; and
a fifth electrode connected to the third and fourth electrodes and connected to a diffusion layer of the transistor.

2. The crossbar switch according to claim 1, wherein at least one of the first and second resistance change films includes at least one of tantalum oxide, titanium oxide, copper sulfide, silver sulfide, and silicon oxide.

3. The crossbar switch according to claim 1, wherein the first and second electrodes include copper.

4. The crossbar switch according to claim 1, wherein the first and second electrodes include a copper interconnect in a multilayer copper interconnect of a semiconductor integrated circuit.

5. The crossbar switch according to claim 1, wherein the third and fourth electrodes include at least one of ruthenium and platinum.

6. A method of manufacturing a crossbar switch comprising:
forming a first insulating film on a semiconductor substrate including a transistor formed thereon;

forming first and second electrodes configured to supply a metal ion by embedding in the first insulating film;

forming a second insulating film configured to cover the first insulating film and the first and second electrodes;

forming first and second opening portions configured to expose part of an upper surface including an end portion of the first electrode from the second insulating film and expose part of an upper surface including an end portion of the second electrode from the second insulating film, the exposed part of the upper surface of the first electrode and the exposed part of the upper surface of the second electrode being in a translational symmetry relation;

forming metal deposition type first and second resistance change films configured to cover respectively the first and second opening portions and to be connected to the exposed parts of the respective upper surfaces including the respective end portions of the respective first and second electrodes at the respective first and second opening portions;

forming third and fourth electrodes connected respectively to upper surfaces of the first and second resistance change films; and forming a fifth electrode connected to the third and fourth electrodes and connected to a diffusion layer of the transistor;

connecting the first electrode to a first interconnect of the crossbar switch; and connecting the second electrode to a second interconnect of the crossbar switch.

7. The method of manufacturing a crossbar switch according to claim 6, wherein the first and second electrodes are exposed with a pattern on an identical photomask and the first and second opening portions are exposed with a pattern on another identical photomask.

8. The method of manufacturing a crossbar switch according to claim 6, wherein at least one of the first and second resistance change films includes at least one of tantalum oxide, titanium oxide, copper sulfide, silver sulfide, and silicon oxide.

9. The method of manufacturing a crossbar switch according to claim 6, wherein the first and second electrodes include copper.

10. A semiconductor device including the crossbar switch according to claim 1 built into a multilayer copper interconnect of a semiconductor integrated circuit that has the multilayer copper interconnect.

11. The crossbar switch according to claim 2, wherein the first and second electrodes include copper.

12. The crossbar switch according to claim 2, wherein the first and second electrodes include a copper interconnect in a multilayer copper interconnect of a semiconductor integrated circuit.

13. The crossbar switch according to claim 3, wherein the first and second electrodes include a copper interconnect in a multilayer copper interconnect of a semiconductor integrated circuit.

14. The crossbar switch according to claim 2, wherein the third and fourth electrodes include at least one of ruthenium and platinum.

15. The crossbar switch according to claim 3, wherein the third and fourth electrodes include at least one of ruthenium and platinum.

16. The crossbar switch according to claim 4, wherein the third and fourth electrodes include at least one of ruthenium and platinum.

17. The method of manufacturing a crossbar switch according to claim 6, wherein the first and second electrodes include a copper interconnect in a multilayer copper interconnect of a semiconductor integrated circuit.

18. The method of manufacturing a crossbar switch according to claim 6, wherein the third and fourth electrodes include at least one of ruthenium and platinum.

19. A semiconductor device including the crossbar switch according to claim 2 built into a multilayer copper interconnect of a semiconductor integrated circuit that has the multilayer copper interconnect.

20. A semiconductor device including the crossbar switch according to of claim 3 built into a multilayer copper interconnect of a semiconductor integrated circuit that has the multilayer copper interconnect.

* * * * *